United States Patent
Bäcklund et al.

(10) Patent No.: US 10,749,239 B2
(45) Date of Patent: Aug. 18, 2020

(54) RADIOFREQUENCY POWER COMBINER OR DIVIDER HAVING A TRANSMISSION LINE RESONATOR

(71) Applicant: General Electric Company, Schenectady, NY (US)

(72) Inventors: Andreas Bäcklund, Uppsala (SE); Dragos Dancila, Uppsala (SE)

(73) Assignee: General Electric Company, Schenectady, NY (US)

(*) Notice: Subject to any disclaimer, the term of this patent is extended or adjusted under 35 U.S.C. 154(b) by 103 days.

(21) Appl. No.: 16/126,726

(22) Filed: Sep. 10, 2018

(65) Prior Publication Data

US 2020/0083586 A1  Mar. 12, 2020

(51) Int. Cl.
H01P 5/18    (2006.01)
H01P 1/12    (2006.01)
H03F 3/60    (2006.01)

(52) U.S. Cl.
CPC .............. H01P 5/183 (2013.01); H01P 1/122 (2013.01); H03F 3/602 (2013.01)

(58) Field of Classification Search
CPC ........... H10P 5/183; H10P 1/122; H03F 3/602
USPC ....................................................... 333/109
See application file for complete search history.

(56) References Cited

U.S. PATENT DOCUMENTS

| | | |
|---|---|---|
| 2,124,029 A | 7/1938 | Conklin et al. |
| 2,181,871 A | 12/1939 | Conklin |
| 2,540,634 A | 2/1951 | Starner et al. |
| 4,034,320 A | 7/1977 | Heckman, Jr. et al. |
| 4,292,610 A | 9/1981 | Makimoto |
| 4,494,087 A | 1/1985 | Dydyk et al. |
| 5,614,875 A | 3/1997 | Jang et al. |
| 6,396,366 B1 | 5/2002 | Raty et al. |
| 2007/0241843 A1* | 10/2007 | D'Ostilio ................. H01P 7/04 333/229 |
| 2015/0318600 A1 | 11/2015 | Gudovich et al. |
| 2017/0317654 A1 | 11/2017 | Velzaco |

OTHER PUBLICATIONS

Carter "RF Power Generation" Lancaster University (35 pages).
Liu et al "A Method for Designing the Variable-Way High-Power Cavity Combiner" Chinese Physical Society; 2016 (6 pages).
(Continued)

*Primary Examiner* — Robert J Pascal
*Assistant Examiner* — Kimberly E Glenn
(74) *Attorney, Agent, or Firm* — The Small Patent Law Group LLC; Dean D. Small

(57) ABSTRACT

Power combiner/divider includes a transmission line (TL) resonator having an inner conductor, an outer conductor that surrounds the inner conductor, and a cavity between the inner conductor and the outer conductor. The inner conductor and the outer conductor are electrically connected at a proximal end of the TL resonator. The power combiner/divider also includes coupling elements extending through respective openings of the outer conductor and into the cavity. The power combiner/divider also includes a capacitive element connected to at least one of the inner conductor or the outer conductor. The capacitive element capacitively couples the inner conductor and the outer conductor at a distal end of the TL resonator.

21 Claims, 13 Drawing Sheets

(56) References Cited

OTHER PUBLICATIONS

Fadden "Solid State Power Amplifier Combiners for Accelerator Applications" School of Electrical and Computer Engineering (7 pages).
Dancila et al. "A Compact 10 kW Solid-State RF Power Amplifier at 352 MHz" 8th International Particle Accelerator Conference; 2017 (8 pages).
"Microwave Vision Grout Radial Power Combiners—Model Number" MVG; 2013 (4 pages).
Getta et al. "Modular High Power Solid State RF Amplifiers for PArticle Accelerators" Proceedings of PAC09 (3 pages).

* cited by examiner

RADIOFREQUENCY POWER COMBINER OR DIVIDER HAVING A TRANSMISSION LINE RESONATOR

BACKGROUND

The subject matter herein relates generally to power combiners that combine radio frequency (RF) power from multiple sources to a common load or to power dividers that split the RF power from a common source to multiple loads.

High-power RF systems that operate at a designated frequency or within a frequency range are used within various technological fields, such as communication, industrial processing, medical imaging, and physics-related research. For example, particle accelerators may be used to generate isotopes. Particle accelerators, such as cyclotrons, include high-power RF generators that create electrical fields for accelerating particles. Static magnetic fields are provided by electromagnets and a magnet yoke that surrounds the acceleration chamber. The electrical fields are generated by a pair of RF dees that are located within the acceleration chamber. To operate the RF dees within the acceleration chamber, a considerable amount of RF power (e.g., 5 kilowatts to 2 megawatts) is generated by the RF power generator and delivered to the RF dees. The RF power generator may include, for example, oscillators, amplifiers, control circuitry, etc.

For applications that use a large amount of RF power, it may not be possible to receive the RF power from a single power source. In such instances, a power combiner combines the RF power from multiple RF power sources and then provides the RF power to the system (e.g., particle accelerator, heater, etc.). RF power combining can be a complex process that addresses various challenges, including impedance transformation and matching, losses, bandwidth, and power limitations. Size of the RF power combiner is another challenge, especially for applications in which the frequency range is less than 300 megahertz (MHz). The size of the RF power combiner is proportional to the wavelength, and the wavelength for 300 MHz or less is relatively large (e.g., one meter or more).

Several techniques for RF power combination are known, but each technique has one or more drawbacks. One technique that may be used to reduce the size of the RF power combiner uses coaxial cables that are wound about in compact space. However, it can be difficult to combine several RF power combiner units in one stage, thereby necessitating several power-combining stages. Each stage adds complexity, size, and additional RF losses to the overall system.

Power vacuum tubes are used for some high-power RF applications, particularly those applications that operate in the lower RF frequency bands. Power vacuum tubes, such as triodes and tetrodes, can be expensive. Although solid-state designs may be theoretically possible for lower RF frequency bands, power vacuum tubes are more cost-effective. For instance, power vacuum tubes are currently more capable of withstanding short-term overload conditions (e.g. output overvoltage, input overdrive, or mismatch load conditions). To address these overload conditions, a solid-state design may use protection circuitry. For example, a solid-state amplifier system that includes transistors may use circulators that direct reflected power to dummy loads to protect the transistors. Circulators can be expensive and also add complexity and size to the overall system. Other active feedback protection systems can be used, but they can also add complexity and size to the overall system.

Although the above discussion relates to power combiners, power dividers may have a similar structure for dividing or splitting the RF power. As such, power dividers may have similar challenges, such as those described above.

BRIEF DESCRIPTION

In an embodiment, a power combiner/divider is provided that includes a transmission line (TL) resonator having an inner conductor, an outer conductor that surrounds the inner conductor, and a cavity between the inner conductor and the outer conductor. The inner conductor and the outer conductor are electrically connected at a proximal end of the TL resonator. The power combiner/divider also includes coupling elements extending through respective openings of the outer conductor and into the cavity. The coupling elements include a plurality of input coupling elements for combining power from multiple sources or a plurality of output coupling elements for dividing power for multiple loads. The power combiner/divider also includes a capacitive element connected to at least one of the inner conductor or the outer conductor. The capacitive element capacitively couples the inner conductor and the outer conductor at a distal end of the TL resonator.

In some aspects, the TL resonator is a quarter-wavelength TL resonator having an operating frequency that is between 10 and 300 megahertz (MHz).

In some aspects, the TL resonator extends lengthwise along a longitudinal axis. The capacitive element includes a first conductive surface that is electrically connected to the inner conductor and a second conductive surface that is electrically connected to the outer conductor. The first and second conductive surfaces face each other and are separated by a gap. Optionally, the capacitive element includes a dielectric material between the first and second conductive surfaces.

In some aspects, the coupling elements include at least ten (10) input coupling elements.

In some aspects, at least one of the coupling elements includes a capacitive coupling element that is positioned within a radial portion of the cavity between the inner conductor and the outer conductor. Optionally, the capacitive coupling element includes a coupling plate. The coupling plate may be movable within the radial portion of the cavity to adjust an amount of capacitive coupling.

In some aspects, at least one of the coupling elements includes an inductive coupling element. Optionally, the inductive coupling element includes a movable element within the cavity and a secured element that electrically connects the movable element to the outer conductor. The movable element is configured to move within the cavity to adjust an amount of inductive coupling.

In some aspects, at least one of the coupling elements is a tapped-in coupling element that is connected to the inner conductor. Optionally, the tapped-in coupling element is movable along a length of the inner conductor.

In some aspects, the power combiner/divider includes a bandwidth adjuster that is coupled to the outer conductor. Optionally, the bandwidth adjuster includes a movable element within the cavity that is coupled to a dummy load or a dummy resistor.

In an embodiment, a power-control system is provided that includes a power divider, a power combiner, and a plurality of power amplifiers. The power amplifiers receive respective inputs from the power divider and provide respective outputs to the power combiner. At least one of the power divider or the power combiner includes a transmission line (TL) resonator comprising an inner conductor, an outer conductor that surrounds the inner conductor, and a cavity between the inner conductor and the outer conductor. The inner conductor and the outer conductor are electrically connected at a proximal end of the TL resonator. The at least one power divider or power combiner also includes a capacitive element connected to at least one of the inner conductor or the outer conductor. The capacitive element capacitively couples the inner conductor and the outer conductor at a distal end of the TL resonator.

In some aspects, the TL resonator is a quarter-wavelength TL resonator having an operating frequency that is between 10 and 300 megahertz (MHz)

In some aspects, the TL resonator extends lengthwise along a longitudinal axis. The capacitive element includes a first conductive surface that is electrically connected to the inner conductor and a second conductive surface that is electrically connected to the outer conductor. The first and second conductive surfaces face each other and being separated by a gap. Optionally, the capacitive element includes a dielectric material between the first and second conductive surfaces.

In some aspects, the at least one power combiner or power divider also includes coupling elements that extend through respective openings of the outer conductor and into the cavity. The coupling elements include at least ten (10) coupling elements.

In an embodiment, a power combiner/divider is provided that includes a transmission line (TL) resonator having an inner conductor, an outer conductor that surrounds the inner conductor, and a cavity between the inner conductor and the outer conductor. The inner conductor has opposite first and second ends and is electrically connected to the outer conductor at the first and second ends. The power combiner/divider also includes coupling elements extending through respective openings of the outer conductor and into the cavity. The coupling elements include a plurality of input coupling elements for combining power from multiple sources or a plurality of output coupling elements for dividing power into multiple loads. The power combiner/divider also includes a capacitive element that capacitively couples the inner and outer conductors. The capacitive element includes a first conductive surface that is electrically connected to the inner conductor and a second conductive surface that is electrically connected to the outer conductor. The first and second conductive surfaces face each other and are separated by a gap.

In some aspects, the capacitive element includes an inner coupling plate having the first conductive surface and an outer coupling plate having the second conductive surface. The outer coupling plate and the inner coupling plate have the gap therebetween.

In some aspects, the TL resonator is a half-wavelength TL resonator. The capacitive element is positioned essentially at a mid-point of the inner conductor.

DETAILED DESCRIPTION

Figure 1:
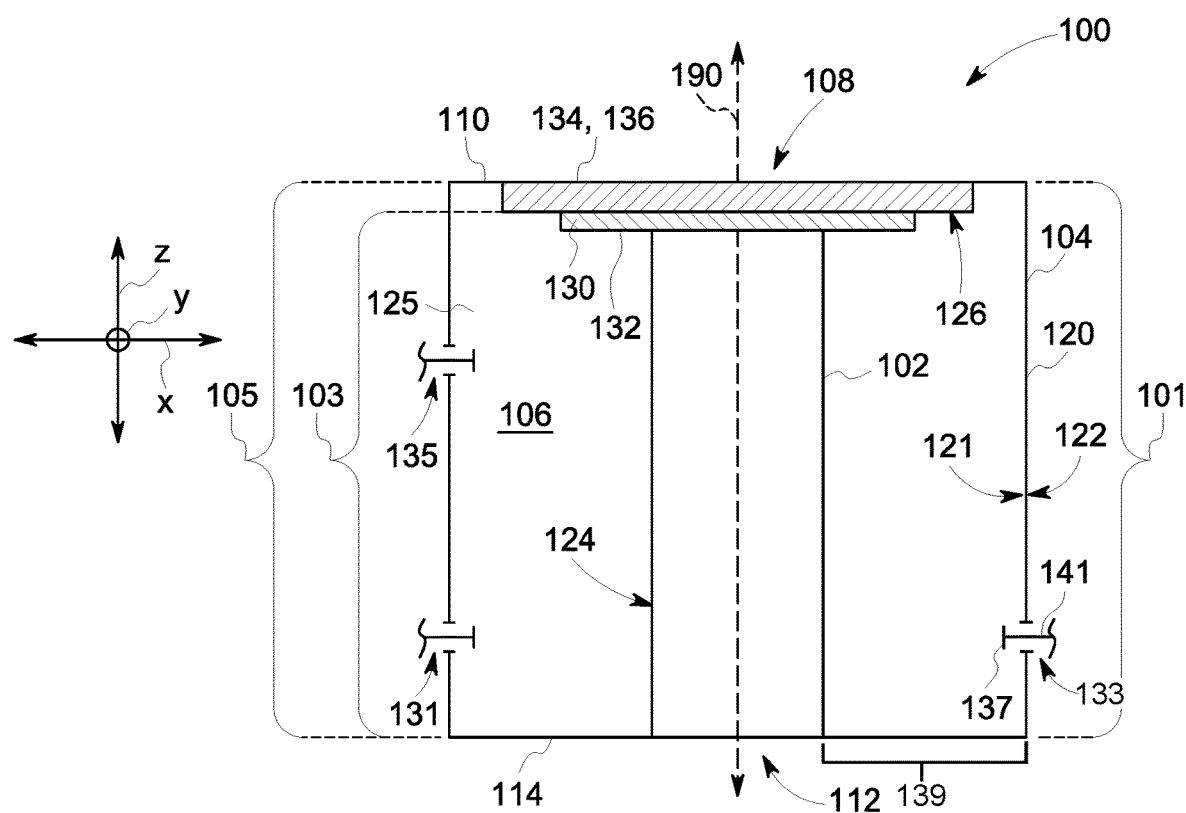
FIG. 1 is a schematic side view of a power combiner formed in accordance with an embodiment.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry.

As used herein, an element or step recited in the singular and proceeded with the word "a" or "an" should be understood as not excluding plural of said elements or steps, unless such exclusion is explicitly stated, such as by stating "only a single" element or step. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments set forth herein include radio-frequency (RF) power combiners and/or dividers and power-control systems that include the same. Embodiments have a transmission line (TL) resonator that includes an open-ended inner conductor, an outer conductor that surrounds the inner conductor, and a cavity that is defined between the inner conductor and the outer conductor. A capacitive element capacitively couples the inner and outer conductors. As such, the TL resonator may also be characterized as a resonant transmission line having a capacitor positioned at an open end of the inner conductor. The TL resonator may form part of a RF power combiner that is used to combine RF power from multiple sources to a common load. The TL resonator may form part of a RF power divider that is used to divide RF power from a common source to multiple loads. The TL resonator may be a quarter-wavelength (QW or λ/4) TL resonator or a half-wavelength (HW or λ/2) TL resonator. The QW or HW TL resonators may be shorter (e.g., than QW or HW, respectively) using the capacitive element as described herein and modified in other manners.

At least some embodiments may include a compact power combiner or power divider. The power combiner and/or the power divider may be characterized as being high-power. As used herein, the term "high-power" means greater than 1,000 W. At least some embodiments may manage five (5) kilowatts or more or ten (10) kilowatts or more. In particular embodiments, the power combiner or the power divider has an operating frequency (e.g., fundamental frequency) that is between 10 megahertz (MHz) and 300 MHz, but the operating frequency may be greater than 300 MHz or less than 10 MHz in other embodiments.

Although the following description is with particular reference to the illustrated structures being power combiners, it should be understood that similar or identical structures may be power dividers if the RF power flows in the opposite direction.

In some embodiments, the TL resonator is a coaxial transmission line resonator (CTLR). CTLR power combiners may be configured for numerous coupling elements (e.g., input and output coupling elements) and multiple different types of coupling elements (e.g., inductive, capacitive, tapped-in). CTLR power combiners may also be configured for a designated ratio of impedance transformation between the power source and the load. As described herein, the power combiner may include a capacitive element that adds a capacitive reactance. Optionally, the capacitive element is positioned near or within the highest electric field (E-field) region or region with the highest RF voltage. The capacitive element is configured to reduce the length of the resonator.

The capacitive element may also be referred to as a capacitor assembly having a first conductive surface that is electrically connected to one element (e.g., inner conductor) and a second conductive surface that is electrically connected to another element (e.g., outer conductor). The first conductive surface may be, for example, a surface of a coupling plate that is secured to the inner conductor. The second conductive surface may be, for example, a surface of an end wall of the outer conductor or other surface of the outer conductor. The first and second conductive surfaces capacitively couple the inner and outer conductors. The capacitance is a function of the area of the conductive surfaces and a permittivity of the dielectric material (or air gap) between the surfaces. The position of the capacitive element (or capacitor assembly) along the inner conductor may be determined by an amount of the RF voltage within the cavity. In particular embodiments, the capacitive element (or capacitor assembly) is positioned along the inner conductor at or near a maximum of the RF voltage.

Power-control systems include amplifier assemblies and RF power generators, such as those used by particle accelerators. Other power-control systems that may utilize a power combiner include applications in communication (e.g., broadcast antennas), industrial processing (e.g., inductive heaters), and medical imaging.

A technical effect provided by one or more embodiments includes a compact design for a power combiner (or divider) that occupies less space than known power combiners (or dividers) that manage an equivalent RF power. A technical effect provided by one or more embodiments includes a re-configurable or tunable power combiner (or divider). Particular embodiments may include a power combiner (or divider) that is highly adaptable and has phase stability, power tolerance, and low loss.

Figure 2:
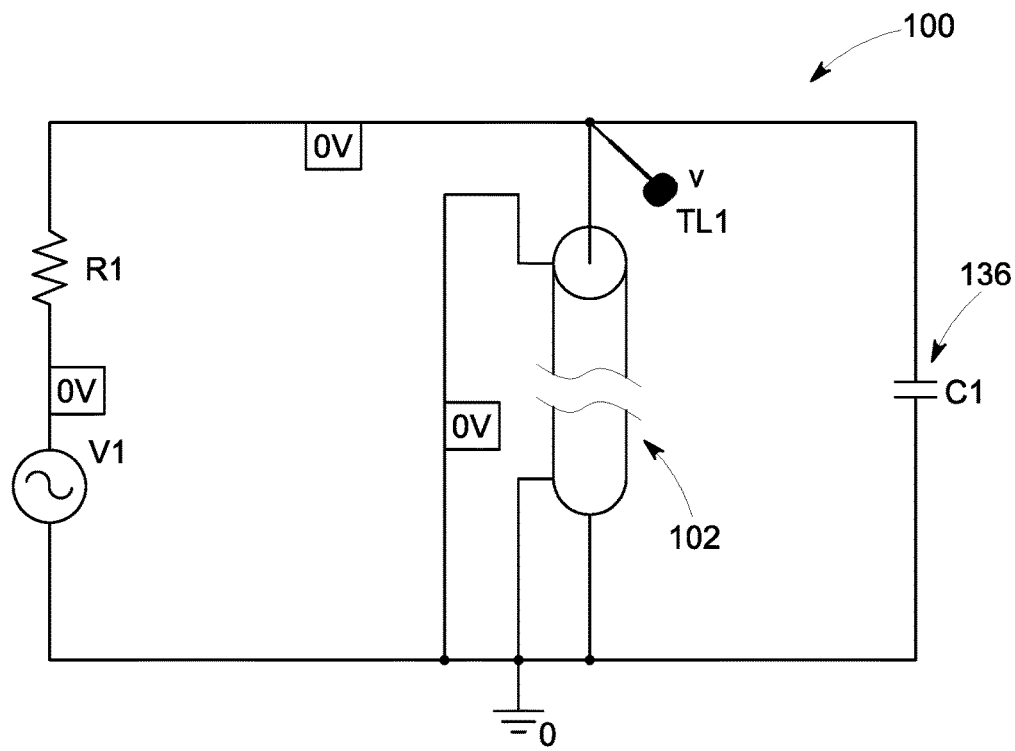
FIG. 2 is a circuit diagram of the power combiner shown in FIG. 1.
Figure 3:
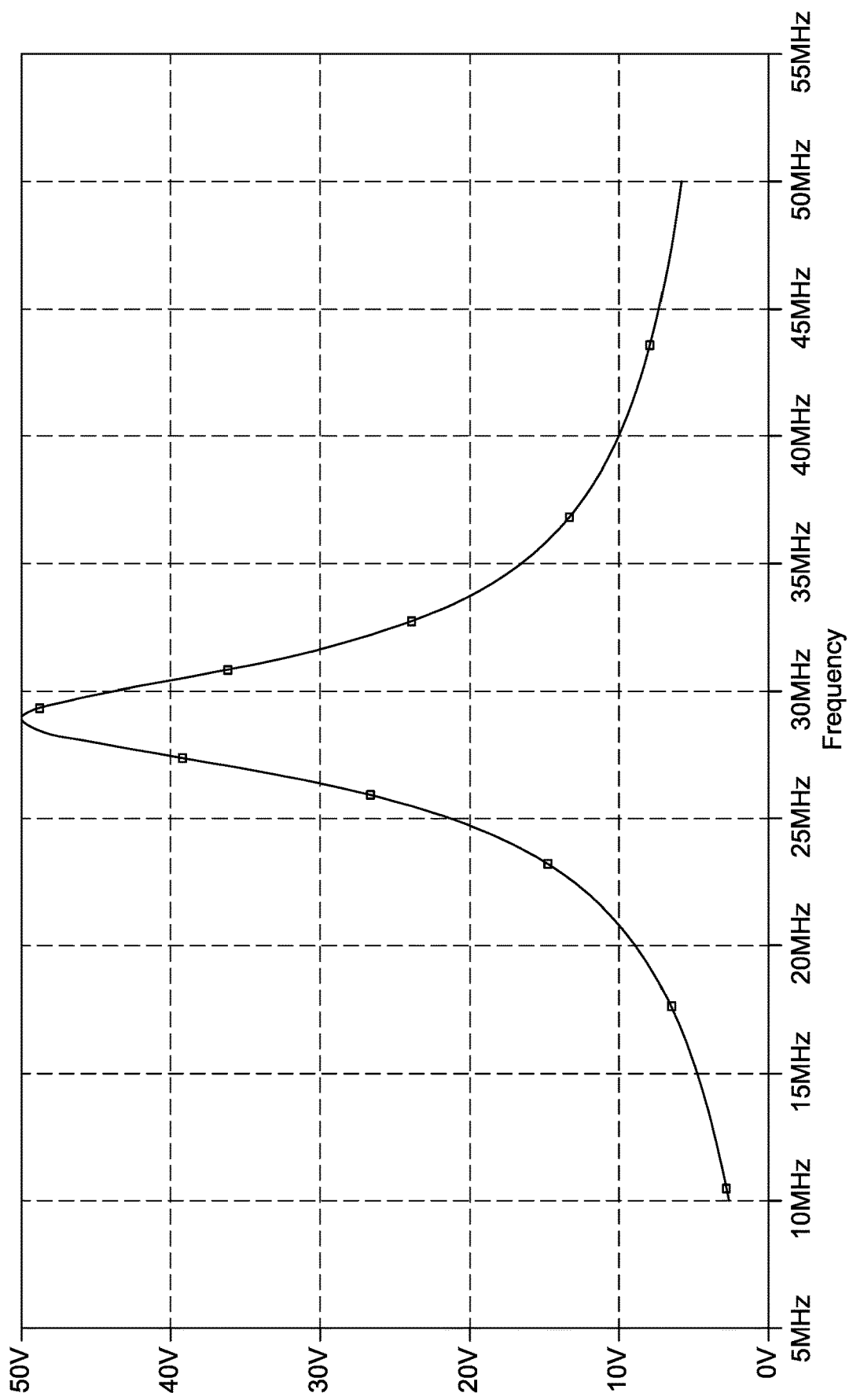
FIG. 3 is a graph based on information obtained from a simulation of the circuit diagram of FIG. 2.

FIG. 1 is a schematic side view of a power combiner/divider 100 formed in accordance with an embodiment, and FIG. 2 is a circuit diagram of the power combiner/divider 100. The following description will now refer to the power combiner/divider 100 within the context of being a power combiner. As shown in FIG. 1, the power combiner/divider 100 is oriented with respect to an X-axis, a Y-axis, and a Z-axis that are mutually perpendicular with one another. During operation, the power combiner/divider 100 may have any orientation with respect to gravity.

The power combiner/divider 100 includes a TL resonator 101 having an inner conductor 102, and outer conductor 104 that surrounds the inner conductor 102, and a cavity 106 therebetween. A longitudinal axis 190 extends through a center of the inner conductor 102 and parallel to the Z-axis. In the illustrated embodiment, the TL resonator 101 also includes a distal end 108 where a distal-end wall 110 is positioned and a proximal end 112 where a proximal-end wall 114 is positioned. As shown, the distal end 108 and the proximal end 112 are at opposite ends of the TL resonator 101. The distal-end and proximal-end walls 110, 114 are mechanically and electrically connected to the outer conductor 104. As shown, the distal-end wall 110 and the proximal-end wall 114 are planar walls that are parallel to each other. In other embodiments, at least one of the distal-end wall 110 or the proximal-end wall 114 is non-planar and/or the distal-end wall 110 and the proximal-end wall 114 are not parallel to one another.

The outer conductor 104 includes a conductive wall 120 having opposite interior and exterior surfaces 121, 122. The inner conductor 102 has a conductive surface 124. The cavity 106 is defined between the conductive surface 124 and the interior surface 121. The power combiner/divider 100 includes input coupling elements 131, 133 and an output coupling element 135. As shown, the input coupling elements 131, 133 and the output coupling element 135 are capacitive coupling elements. It should be understood, however, that one or more of the coupling elements 131, 133, 135 may be inductive coupling elements and/or one or more of the coupling elements 131, 133, 135 may be tapped-in coupling elements. There may be more than one output coupling element and more than two input coupling elements in other embodiments. As shown, each of the coupling elements 131, 133, 135 may have a coupling plate 137 positioned within a radial portion 139 of the cavity 106 at a designated distance away from the inner conductor 102. The coupling plate 137 is directly connected to a conductive pathway 141 that extends to a remote location with respect to the power combiner/divider 100.

The cavity 106 includes an insulating medium 125. In the illustrated embodiment, the insulating medium 125 may be a vacuum or a designated gas (e.g., ambient air or predetermined gaseous composition). In other embodiments, the insulating medium 125 may have a more solid or solid dielectric material, such as a foam or gel, or may have a mixture of solid and gas. In high-power applications, dimensions of the TL resonator 101 may be relatively large (e.g., tens of centimeters (cm) or more), thereby reducing the electric field strength and the surface current density. In such embodiments, ambient air may be the insulating medium 125.

The inner conductor 102 has an inner-conductor length 103 measured along the Z-axis and the outer conductor 104 has an outer-conductor length 105 measured along the Z-axis. In the illustrated embodiment, the inner-conductor length is 30 cm. The inner-conductor length 103 and the outer-conductor length 105, however, may have other values based on the frequency of operation. For embodiments that do not include a capacitive element 130 and a larger gap 126, the inner-conductor length 103 may be about a quarter of the wavelength at the fundamental resonance frequency (f). For embodiments in which the TL resonator 101 is a QW TL resonator, the TL resonator 101 may be configured to resonate at odd harmonics of the fundamental (f, 3f, 5f, . . . ). For embodiments in which the TL resonator 101 is a HW TL resonator, the TL resonator 101 may be configured to resonate at odd or even harmonics of the fundamental (f, 2f, 3f, 4f, 5f, . . . ).

The inner and outer conductors 102, 104 have cross-sections taken perpendicular to the Z-axis (or along taken along the XY plane) that may have a variety of cross-sectional shapes (e.g., circular-shape, rectangular-shape, other polygonal shape, etc.). In the illustrated embodiment, dimensions of the inner and outer conductors 102, 104 (e.g., diameter, width, depth) do not change along the Z-axis. As such, the cross-sectional shapes of the inner and outer conductors 102, 104 may be uniform along the Z-axis. In other embodiments, the cross-sectional shapes of the inner and outer conductors 102, 104 may gradually change along the Z-axis at a linear or non-linear rate, or may step-up or step-down along the Z-axis.

In the illustrated embodiment, the inner conductor 102 is concentric with the outer conductor 104 and the longitudinal axis 190 such that the TL resonator 101 is a coaxial transmission line resonator (CTLR). In other embodiments, however, the inner conductor 102 and the outer conductor 104 are not concentric. FIGS. 15-24 illustrate how the inner conductors 501 and outer conductor 503 of a TL resonator may have different shapes and dimensions.

Similar to the inner and outer conductors 102, 104, the cavity 106 may have a cross-sectional profile taken along the XY plane. The cross-sectional profile may have a variety of dimensions based on the cross-sectional shapes of the inner and outer conductors 102, 104. Depending upon the desired power, the area of the cross-sectional profile may be between a few square millimeters (e.g., for low power applications) and one or more square meters (e.g., for high power applications).

The inner conductor 102 and the outer conductor 104 are electrically connected at a proximal end 112 of the TL resonator 101. As used herein, the term "electrically connected" means two conductive elements are connected such that a conductive path is established for current flow between the two conductive elements. The two conductive elements may be directly attached to each other (e.g., welded to each other) or may have an intervening conductive pathway therebetween (e.g., through a conductive wire). In FIG. 1, the inner conductor 102 is electrically connected to the outer conductor 104 through the proximal-end wall 114 of the outer conductor 104. The proximal-end wall 114 may be referred to as the shorting plane. The inner conductor 102 is not mechanically connected to the outer conductor 104 at the distal-end wall 110. The inner conductor 102 does not electrically connect to the distal-end wall 110 and, as such, is open-ended proximate to the distal-end wall 110. More specifically, an end of the inner conductor 102 is closer to the distal-end wall 110 than the proximal end-wall 114. For example, a gap 126 exists between a surface that is electrically connected to the outer conductor 104 and a surface that is electrically connected to the inner conductor 102. More specifically, the gap 126 exists between a surface of the distal-end wall 110 and a surface forming a capacitive element 130.

At resonance, the RF voltage and the E-field will be at a maximum at the open end of the inner conductor 102 and essentially zero at the shorting plane. In the illustrated embodiment, the open end is effectively located at the capacitive plate 132, and the shorting plane corresponds to the proximal-end wall 114. The voltage and the E-field increase (e.g., exponentially) along the Z-axis from the shorting plane (or the proximal-end wall 114) to the open end (or the capacitive plate 132). The current and magnetic field (H-field) will be at a maximum at the shorting plane and essentially zero at the open end. The current and the H-field increase (e.g., exponentially) along the Z-axis from the open end to the shorting plane.

The geometry of the TL resonator 101 may be configured to achieve a designated electrical performance. For example, a characteristic impedance ($Z_0$) can be varied along the Z-axis to achieve a specific property or a combination of properties. A change in $Z_0$ will change a distribution of the E-field and a distribution of the H-field. The geometry may also be configured for mechanical reasons, such as enabling an easier method of attaching the TL resonator 101 to another structure, or for spatial requirements, such as being able to position the TL resonator 101 within a confined space or to incorporate a frequency tuning device. In some embodiments, a length of the TL resonator 101 may be reduced for the same resonance frequency by increasing a diameter of the inner conductor 102 proximate to the open end or reducing a diameter of the outer conductor 104 proximate to the open end.

Also shown in FIG. 1, the inner conductor 102 and the outer conductor 104 are capacitively coupled by a surface of the capacitive element 130 that faces the distal-end wall 110. As shown, the capacitive element 130 includes a capacitive plate 132 that is connected to the inner conductor 102 and isolated from the distal-end wall 110 (and outer conductor 104) by the insulating medium 125. The capacitive plate 132 and the distal-end wall 110 are separated by the gap 126. In other embodiments, the capacitive plate 132 may capacitively couple to the outer conductor 104 more directly (e.g., not through the distal-end wall). For example, a broad side of the capacitive plate 132 may face radially away from the longitudinal axis 190 toward the outer conductor 104. Alternatively or in addition to the capacitive plate 132, a capacitive plate may be connected to the outer conductor 104. For example, one or more capacitive plates may capacitively couple the inner conductor 102 and the outer conductor 104. In other embodiments, a discrete capacitor (e.g., conventional off-the-shelf capacitor) may extend across the gap 126. More specifically, the discrete capacitor may be electrically connected to each of the inner conductor 102 and the distal-end wall 110 (or the outer conductor 104) to capacitively couple the inner conductor 102 and the distal-end wall 110 (or the outer conductor 104).

Capacitance provided by a capacitive plate may shorten a length of the TL resonator or the inner-conductor length. As one example, the TL resonator 101 may have an inner-conductor length 103 of 2.57 meters (m) for a resonant frequency of 29 MHz with a characteristic impedance of 75 ohm. In such a configuration, the capacitive plate 132 alone (with no added dielectric material between the capacitive plate 132 and the distal-end wall) yields a capacitance of approximately 0.19 nF. This capacitance may shorten the inner-conductor length 103 from 2.57 m to 0.6 m (or by 77%) for the same resonant frequency of 29 MHz. In this example, the gap 126 includes air, which has a relative permittivity of 1.0.

Additional capacitance may further shorten the inner-conductor length and, consequently, a length or height of the TL resonator. For the same area and separation distance that defines the gap 126, capacitance will increase as the relative permittivity increases. In the illustrated embodiment, a dielectric material 134 (other than the insulating medium 125) is positioned within the gap 126. More specifically, a dielectric plate or disc 136 is inserted between the capacitive element 130 (or the capacitive plate 132) and the outer conductor 104 to increase the capacitance. The capacitance added by the dielectric material 134 may further shorten the length of the TL resonator 101 or the inner-conductor length 103. For example, the dielectric plate 136 in FIG. 1 may be a layer of polytetrafluoroethylene (PTFE) that has an area of 0.022 meters-squared ($m^2$), a relative permittivity of 2.1, and a thickness of 0.001 m. In the illustrated embodiment, the characteristic impedance is 75 ohm. The capacitive plate 132 and the dielectric plate 136 provide an added capacitance of 0.4 nF within the gap 126 and shorten the inner-conductor length 103 to 0.3 m (or by 88%) for the same resonant frequency of 29 MHz. When the physical length of a TL resonator is shorter than QW, the TL resonator will appear inductive and be brought to resonance with the added capacitance.

An approximate length of the capacitively-compensated QW resonator may be a function of the wave propagation speed, the desired fundamental frequency, the added capacitance, and the characteristic impedance of the transmission line. The reduced length will come at the cost of a decrease in bandwidth.

Figure 4:
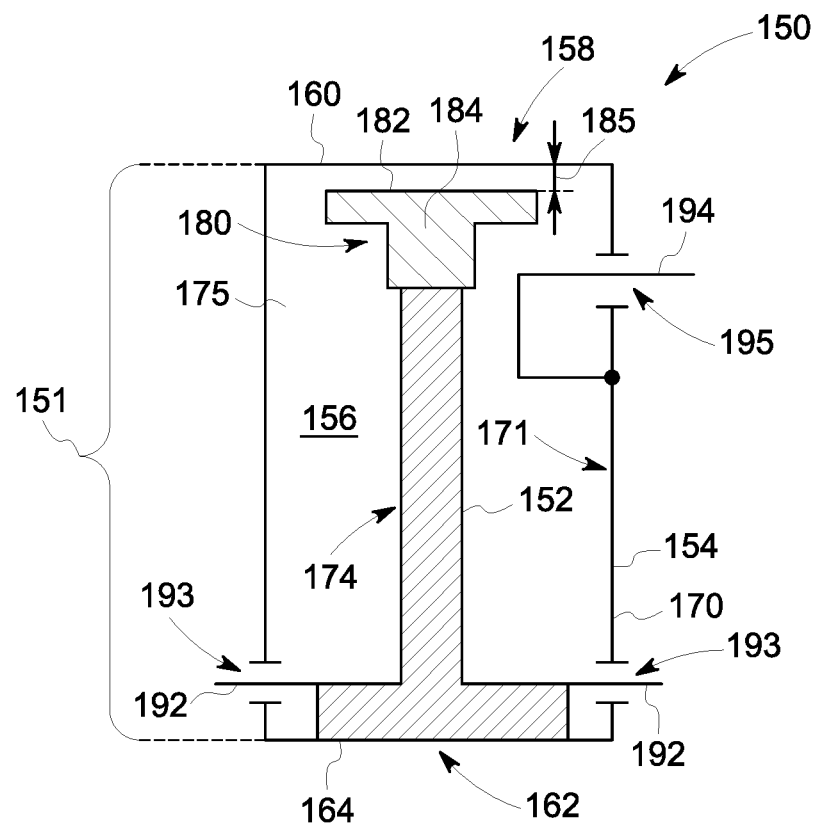
FIG. 4 illustrates a cross-section of a power combiner formed in accordance with an embodiment that includes an output coupling element and a plurality of input coupling elements.
Figure 5:
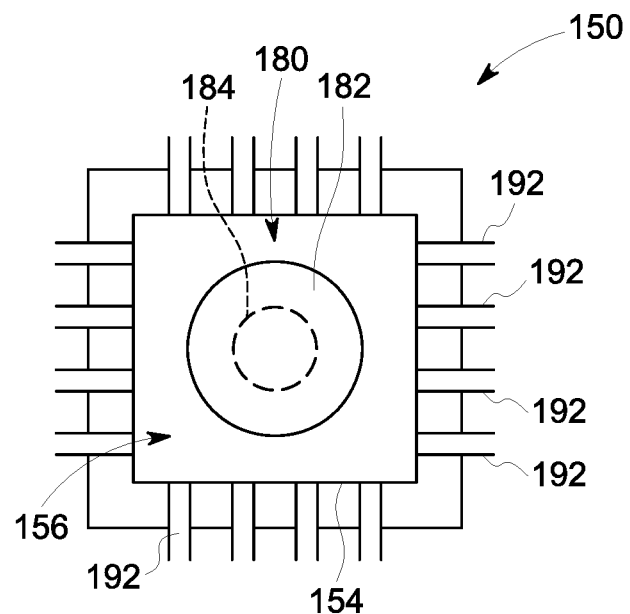
FIG. 5 is a top-down view of the power combiner of FIG. 4.

FIG. 4 illustrates a cross-section of a power combiner 150 formed in accordance with an embodiment, and FIG. 5 is a top-down view of the power combiner 150. The power combiner 150 may be similar to the power combiner/divider 100 (FIG. 1). For example, the power combiner 150 may include a TL resonator 151 having an inner conductor 152, an outer conductor 154 that surrounds the inner conductor 152, and a cavity 156 therebetween. In the illustrated embodiment, the TL resonator 151 also includes a distal end 158 where a distal-end wall 160 is positioned and a proximal end 162 where a proximal-end wall 164 is positioned. The outer conductor 154 includes a conductive wall 170, and the inner conductor 152 has a conductive surface 174. The cavity 156 is defined between the conductive surface 174 and an interior surface 171 of the conductive wall 170. The cavity 156 may include an insulating medium 175, such as those described above. In the illustrated embodiment, the insulating medium 175 is a vacuum or a designated gas (e.g., ambient air or predetermined gaseous composition).

As shown in FIGS. 4 and 5, the TL resonator 151 has a capacitive element 180. The capacitive element 180 is T-shaped including a capacitive plate 182 and a coupling portion 184. The coupling portion 184 may have a receiving space (not shown) for receiving an end of the inner conductor 152. Optionally, the inner conductor 152 may have threads at the end of the inner conductor 152 and the coupling portion 184 may have an interior surface with corresponding threads. When the capacitive element 180 is rotated, the threads may cause fine-adjustment of the Z-position of the capacitive plate 182. As such, a gap 185 (FIG. 4) between the capacitive plate 182 and distal-end wall 160 may be increased or decreased to tune the electrical performance of the power combiner 150.

The power combiner 150 also includes a plurality of input coupling elements 192 and a single output coupling element 194. In other embodiments, the power combiner 150 may include a plurality of output coupling elements. The input coupling elements 192 extend through respective openings 193 of the outer conductor 154 and into the cavity 156. The output coupling element 194 extends through a respective opening 195 of the outer conductor 154 and into the cavity 156. Each of the input coupling elements 192 is electrically connected to an input source. The output coupling element 194 is electrically connected to a load.

The input coupling elements 192 and the output coupling element 194 can be selected and arranged to achieve a designated electrical performance. For the input coupling elements and the output coupling elements, the number, type, position along the Z-axis, and position with respect to the outer conductor 154 and/or the inner conductor 152 may be selected to achieve the designated performance. The input and output coupling elements 192, 194 can be selected and arranged to a load impedance experienced by each of the input sources. For example, a position (or level) along the Z-axis of the input coupling element 192 and/or the output coupling element 194 corresponds to a designated voltage to current ratio or impedance. Positioning the coupling element near a shorting plane yields a low impedance, whereas coupling near the open end of the inner conductor yields a high impedance.

To combine the RF power from a plurality of input sources, the input coupling elements can be distributed radially with respect to the inner conductor. Optionally, the input coupling elements can be distributed symmetrically as shown in FIG. 5. Optionally, the input coupling elements can be positioned at the same level along the Z-axis to share the load and divide the impedance equally. For a configuration having multiple input sources, the load impedance experienced by each input source will be divided by the number of input sources, assuming the input sources have equal output impedances.

Figure 6:
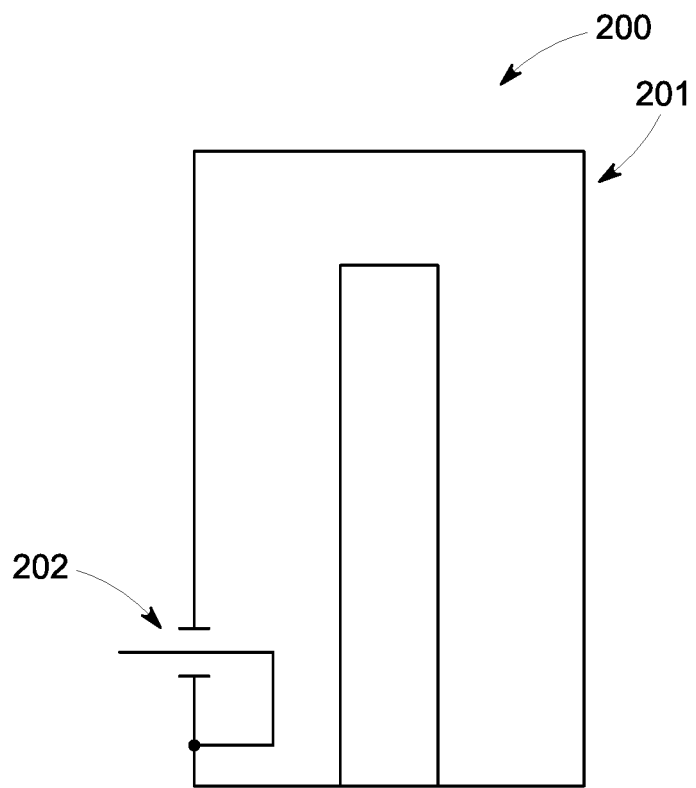
FIG. 6 is a schematic side view of a power combiner formed in accordance with an embodiment that includes an inductive coupling element.
Figure 7:
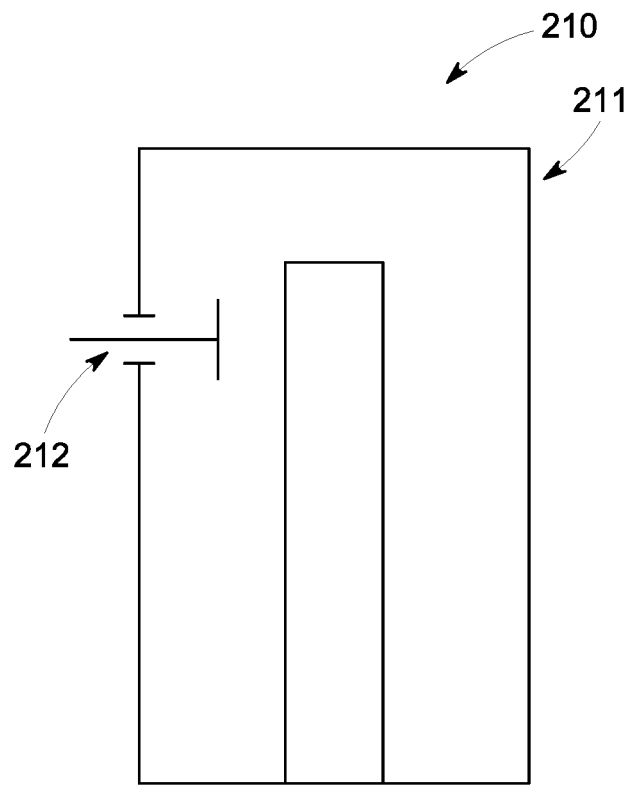
FIG. 7 is a schematic side view of a power combiner formed in accordance with an embodiment that includes a capacitive coupling element.
Figure 8:
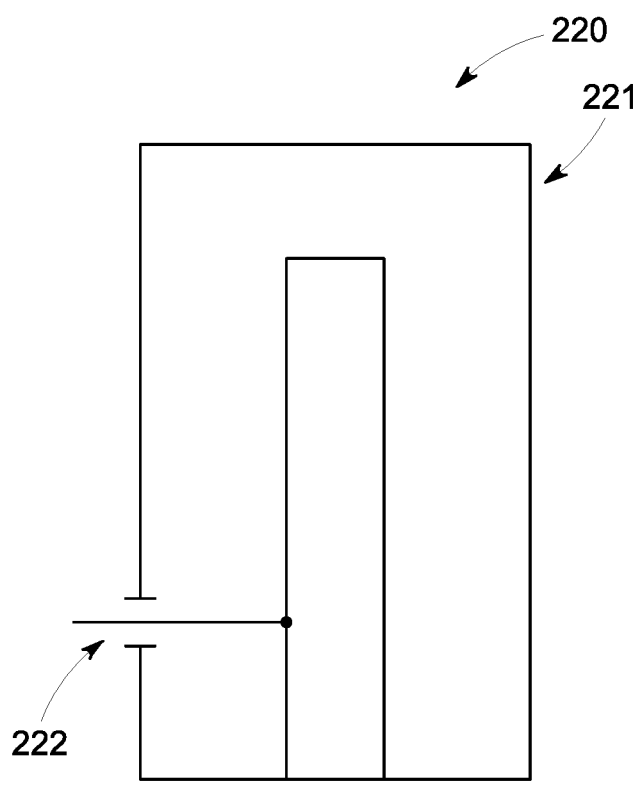
FIG. 8 is a schematic side view of a power combiner formed in accordance with an embodiment that includes a direct (or tapped-in) coupling element.

FIGS. 6-9 illustrate different types of coupling elements and positions that the coupling elements may have along a TL resonator. More specifically, FIG. 6 is a schematic side view of a power combiner 200 having a TL resonator 201 operably connected to an inductive coupling element 202. FIG. 7 is a schematic side view of a power combiner 210 having a TL resonator 211 operably connected to a capacitive coupling element 212. FIG. 8 is a schematic side view of a power combiner 220 having a TL resonator 221 that is operably connected to a direct (or tapped-in) coupling element 222.

Figure 9A:
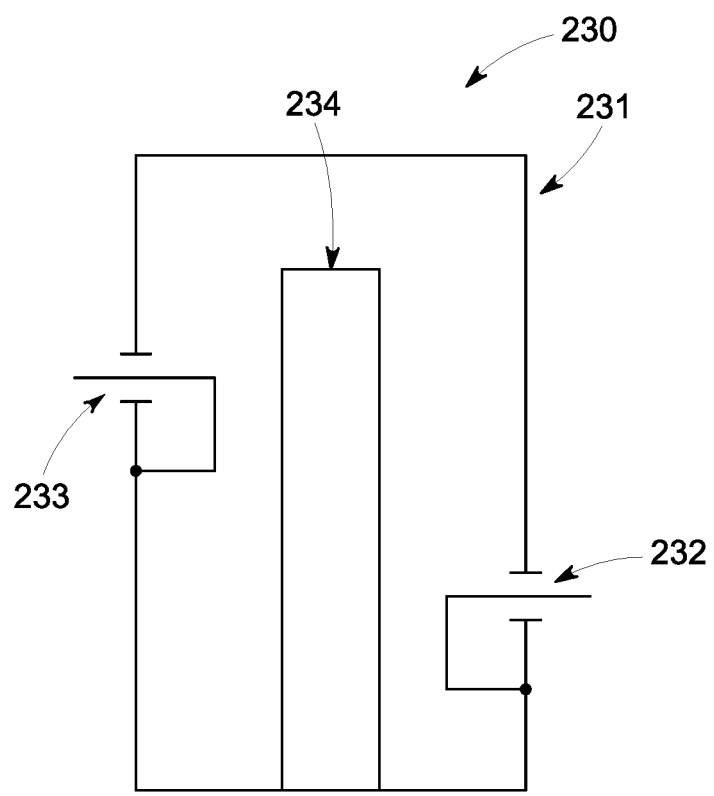
FIG. 9A illustrates a schematic side view of a power combiner formed in accordance with an embodiment that includes an output coupling element and an input coupling element that are selectively positioned along a Z-axis for controlling impedance.
Figure 9B:
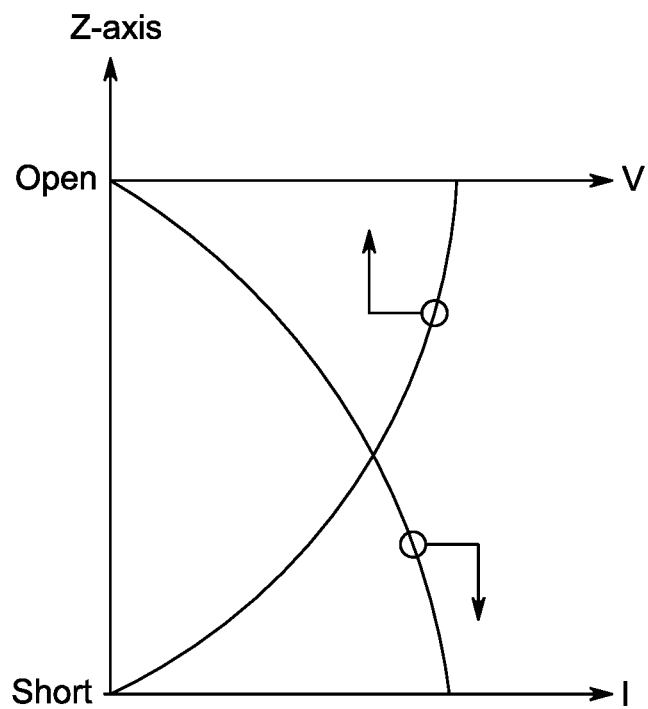
FIG. 9B illustrates how RF voltage and current and E- and H-fields change within the cavity between the shorting plane and the open end.

FIG. 9A illustrates a schematic side view of a power combiner 230 having a TL resonator 231 that is operably connected to an output coupling element 232 and an input coupling element 233 that are selectively positioned along a Z-axis for controlling impedance. FIG. 9B illustrates how RF voltage and current the E-field and H-field change within the cavity between the shorting plane and the open end. At resonance, the RF voltage, and the E-field, will be maximum at the open end of the inner conductor and zero at the shorting plane. The current, and the H-field, will be the opposite; maximum at the shorting plane and zero at the open end.

With respect to FIG. 9A, the coupling elements 232 or 233 are identical and either of the coupling elements 232 or 233 may be an input coupling element or an output coupling element. If identical coupling elements are positioned at a common level (or the same level) along the inner conductor and one is an input coupling element for an input source and the other is an output coupling element for a load, the impedance transformation between the load and the input source will be essentially 1:1. In other words, there will be no impedance transformation. If the input coupling element is positioned closer to an open end 234 than the output coupling element, however, the load impedance at the input coupling element will be stepped up. If the output coupling element is positioned closer to the open end 234 than the input coupling element, the load impedance will be stepped down. In this manner, the TL resonator 231 may function as a variable impedance transformer between source and load.

As described herein, the electrical performance of an input coupling element or an output coupling element is a function of the position of the respective coupling element relative to the inner conductor, the type of the respective coupling element, and the size and shape of the respective coupling element. Each of the coupling elements 202, 212, 222, 232, and 233 may be configured to couple RF power to and/or from the respective TL resonator. Each type of coupling element is described in greater detail below.

Figure 10:
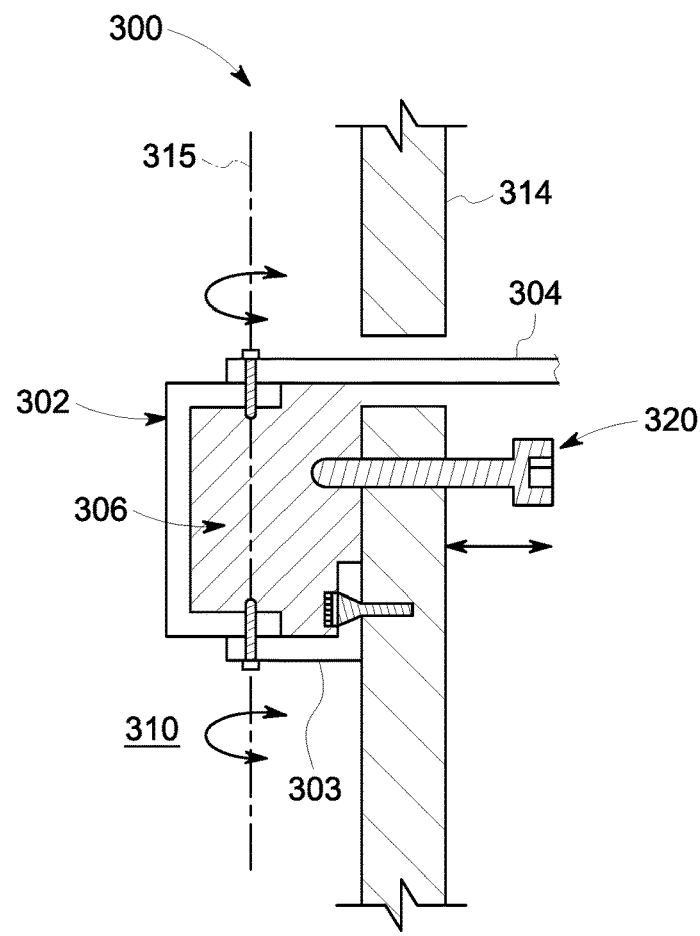
FIG. 10 is a cross-section of an inductive coupling element formed in accordance with an embodiment that is configured for selective tuning.

FIG. 10 is a cross-section of an inductive coupling element 300 formed in accordance with an embodiment that is configured for selective tuning. In particular embodiments, the inductive coupling element 300 is configured for coarse-tuning (or gross-tuning) and fine-tuning. As shown, the inductive coupling element 300 includes a movable element 302, a secured element 303, and an optional secured element 304. As shown, each of the elements 302-304 is an elongated conductive beam. The movable element 302 has a non-linear shape (e.g., C-shape or looped) and is movably coupled to the secured elements 303, 304. The secured element 303 is secured (e.g., through a screw) to the outer conductor 314. The secured element 303 is electrically connected to the outer conductor 314.

A coupling region 306 is defined by the movable element 302, the secured element 303, and the optional secured element 304. The inductive coupling element 300 is positioned within a cavity 310 between an inner conductor (not shown) and an outer conductor 314. The coupling region 306 is a region that is oriented substantially perpendicular or transverse to the magnetic field within the cavity 310. The coupling region 306 is oriented substantially perpendicular to magnetic field lines. A total size of the coupling region 306 may determine an amount of inductive coupling.

Inductive coupling between the TL resonator and the inductive coupling element is strongest when the coupling region has a maximum size and is positioned closer to the inner conductor 312 and closer to the cavity shorting plane, i.e., within the region of maximum H-field. When the movable element 302 is moved, the total size of the coupling region 306 changes and, as such, the amount of inductive coupling between the coupling loop and a magnetic field within the cavity is changed. For example, the movable element 302 may be rotated about an axis 315. The movable element 302 provides a coarse-tuning mechanism for the inductive coupling element 300 and the associated TL resonator.

The inductive coupling element 300 also provides a fine-tuning mechanism. As shown, a conductive element 320 is grounded to the outer conductor 314 and extends into the cavity 310. The conductive element 320 is a screw in the illustrated embodiment but may be another conductive element in other embodiments. The conductive element 320 affects the coupling region 306 and, consequently, an amount of coupling between the coupling element 300 and the magnetic field within the cavity 310. The coupling region 306 is effectively decreased when the conductive element 320 (e.g., screw) is adjusted inwards the cavity 310.

Figure 11:
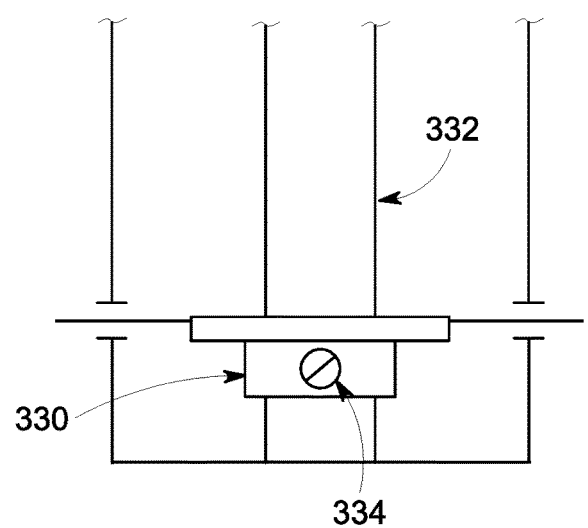
FIG. 11 is a side view of a tapped-in coupling element formed in accordance with an embodiment that is configured for selective tuning.

FIG. 11 is a side view of a tapped-in coupling element 330 formed in accordance with an embodiment that is configured for selective tuning. The coupling element 330 is directly connected to multiple conductive pathways (e.g., pieces of stamped sheet metal or conductive wires) that electrically connect respective input sources to the power combiner/divider. The coupling element 300 is movable along the Z-axis along an inner conductor 332. In the illustrated embodiment, the coupling element 330 is T-shaped, but other shapes may be used. To secure the coupling element 330 to a designated position along the inner conductor 332, a fastener 334 (e.g., set screw) may be used. As shown in FIG. 11, only one coupling element 330 is used. The coupling element 330 is capable of simultaneously adjusting the load impedance for the input sources. More specifically, as the coupling element 330 is moved up or down along the inner conductor 332, the conductive pathway for each input source moves with the coupling element 330. As such, the input sources may be collectively tuned in one single movement, instead of tuning each input coupling element individually. Optionally, one or more of the input sources may be individually tuned (e.g., after collectively tuning within one single movement).

Figure 12:
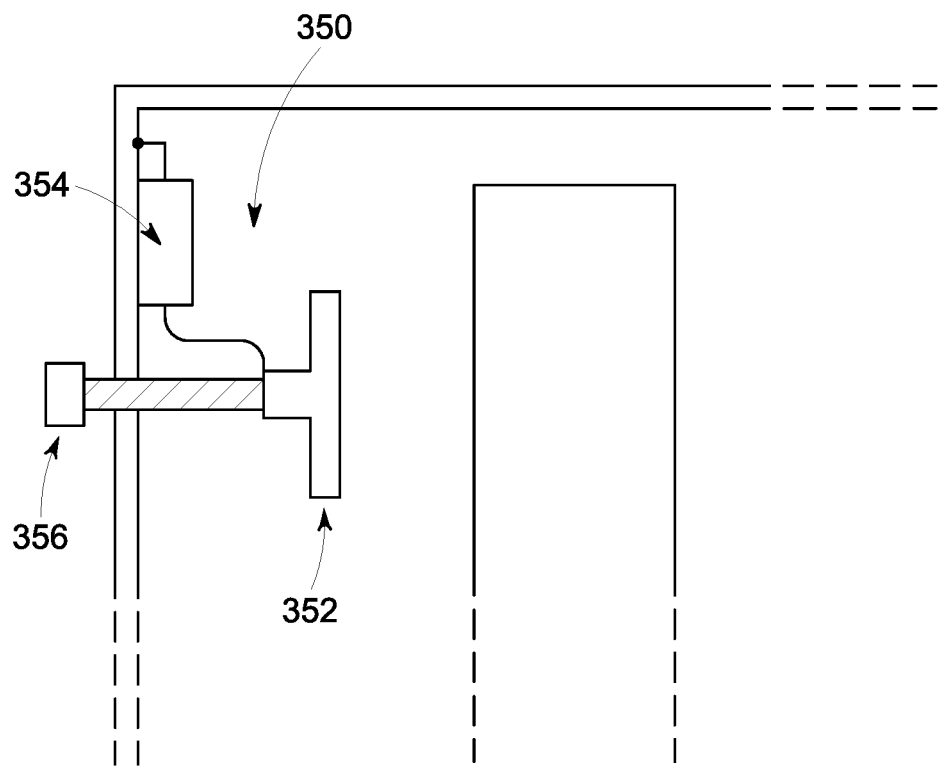
FIG. 12 is a cross-section of a bandwidth adjuster formed in accordance with an embodiment.

FIG. 12 is a cross-section of a coupling element (or bandwidth adjuster) 350 formed in accordance with an embodiment. The bandwidth adjuster 350 includes a coupling plate 352, a dummy resistor 354, and a mechanism for adjusting a radial position of the coupling plate 352. In the illustrated embodiment, a screw 356 is used as the adjustment mechanism and may move the coupling plate 352 to and form the inner conductor. The dummy resistor 354 is capacitively coupled to the TL resonator through the coupling plate 352 and is held by the screw 356. The radial position of the coupling plate 352 will affect the bandwidth of the TL resonator by resistive loading.

Figure 13:
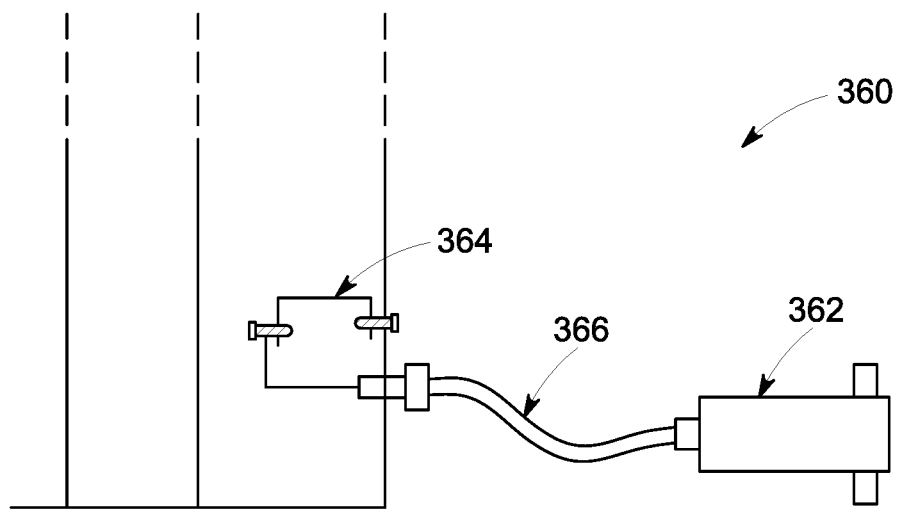
FIG. 13 is a cross-section of a bandwidth adjuster formed in accordance with an embodiment.

FIG. 13 is a cross-section of a coupling element (or bandwidth adjuster) 360 formed in accordance with an embodiment. The bandwidth adjuster 360 includes a dummy load 362, an adjustable loop 364 similar to the adjustable loop described above, and a coaxial cable 366. The adjustable loop 364 may be positioned to determine a bandwidth of the TL resonator.

Figure 14:
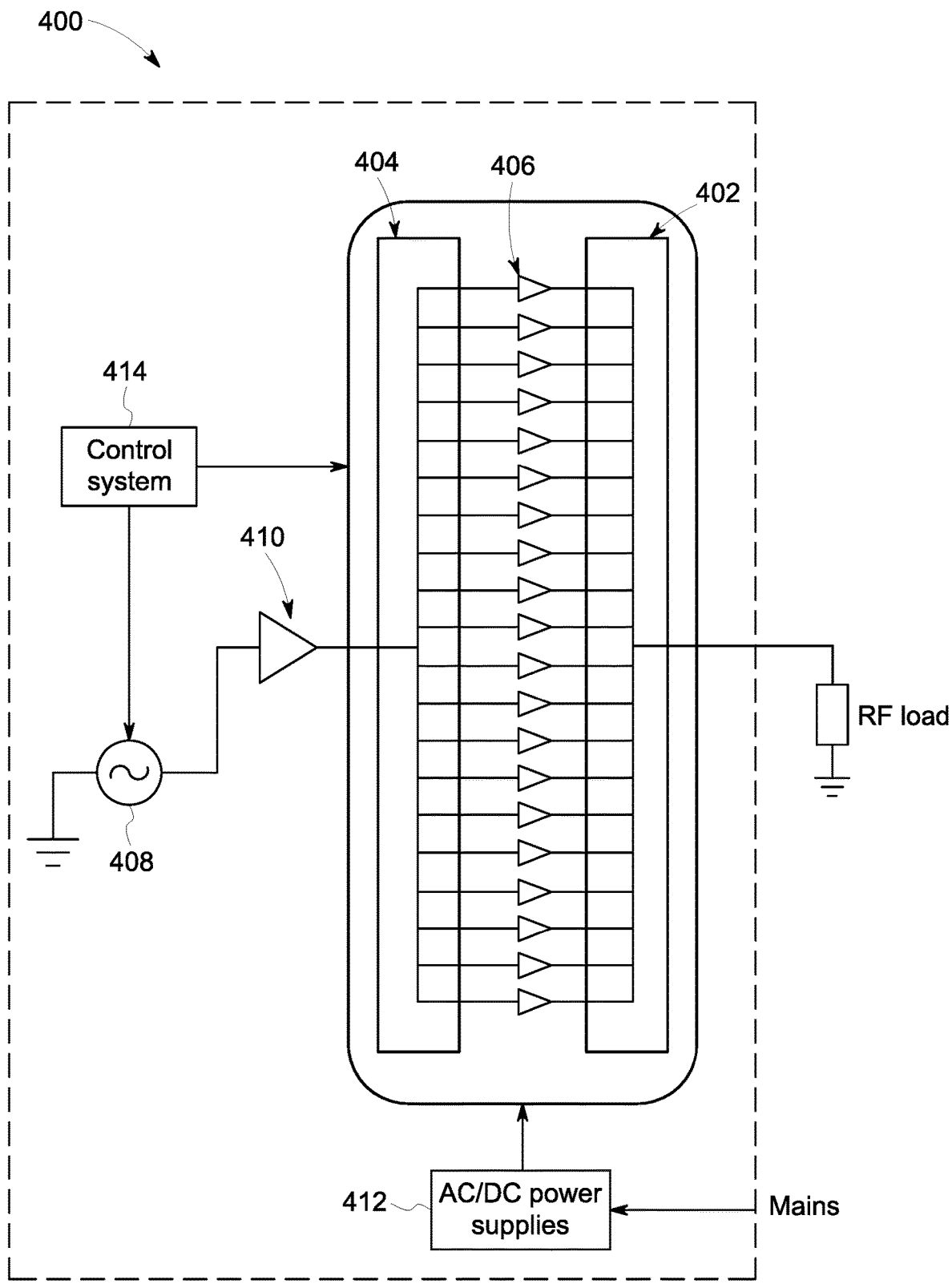
FIG. 14 is a schematic view of a power amplifier system that includes a plurality of power combiners formed in accordance with an embodiment.
Figure 15:
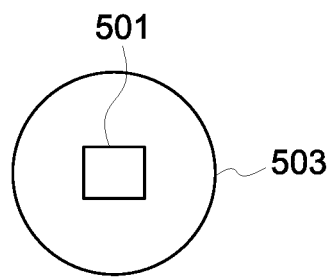
FIG. 15 is a cross-sectional view of a power combiner having a rectangular inner conductor and a circular outer conductor that are coaxial.
Figure 16:
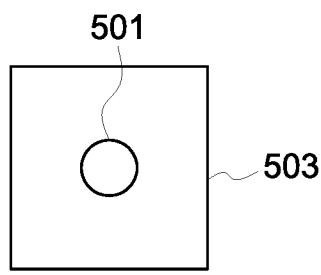
FIG. 16 is a cross-sectional view of a power combiner having a circular inner conductor and a rectangular outer conductor that are coaxial.
Figure 17:
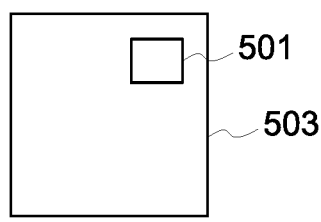
FIG. 17 is a cross-sectional view of a power combiner having a rectangular outer conductor and a rectangular inner conductor in which the inner conductor is offset from a center of the outer conductor.
Figure 18:
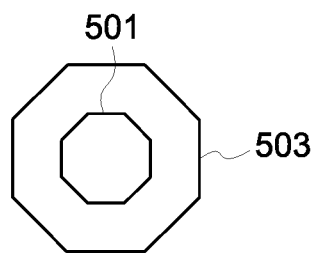
FIG. 18 is a cross-sectional view of a power combiner having an octagonal outer conductor and a similar octagonal inner conductor that are coaxial.
Figure 19:
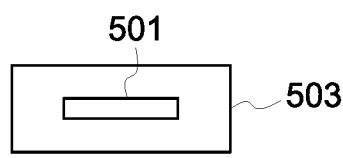
FIG. 19 is a cross-sectional view of a power combiner having an elongated, rectangular outer conductor and a similar rectangular inner conductor that are coaxial.
Figure 20:
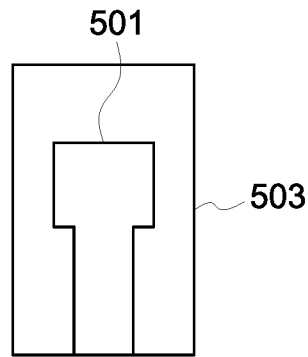
FIG. 20 is a side cross-section of a power combiner having coaxial inner and outer conductors in which the inner conductor has a first diameter while extending toward an open end of the inner conductor and a greater second diameter at the open end of the inner conductor.
Figure 23:
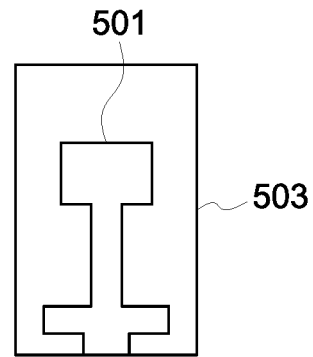
FIG. 23 is a side cross-section of a power combiner having coaxial inner and outer conductors in which the inner conductor has first, second, and third diameters, wherein the second diameter is less than the first diameter and less than the third diameter.
Figure 21:
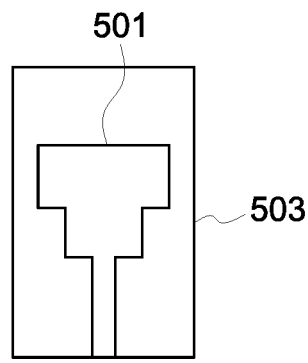
FIG. 21 is a side cross-section of a power combiner having coaxial inner and outer conductors in which the inner conductor has first, second, and third diameters that increase incrementally as the inner conductor extends toward the open end.
Figure 24:
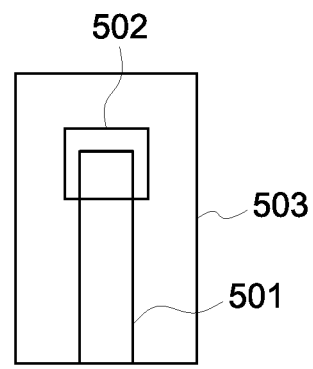
FIG. 24 is a side cross-section of a power combiner having coaxial inner and outer conductors in which the inner conductor has a cap or top that is movable up or down and functions as a frequency tuning device.
Figure 22:
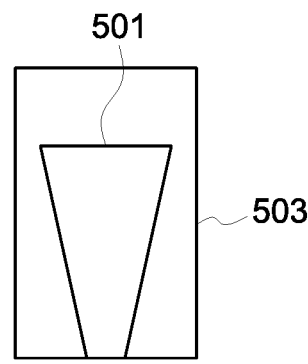
FIG. 22 is a side cross-section of a power combiner having coaxial inner and outer conductors in which the inner conductor has a diameter that increases at a designated rate as the inner conductor extends toward the open end.

FIG. 14 is a schematic view of a power-control system 400 formed in accordance with an embodiment. The power-control system 400 may use many power modules that are combined into a single load or more than one load. As shown, the power-control system 400 includes a RF combiner 402, a RF divider (or splitter) 404, and a plurality of power amplifiers 406. The RF combiner 402 and/or the RF divider 404 may include a TL resonator having a similar structure as described herein. In the illustrated embodiment, each of the power amplifiers 406 is configured to receive an input (e.g., 5 W) from the RF divider 404 and generate an output that is directed to the RF combiner 402.

The power-control system 400 may also include an RF source 408 and an RF preamplifier 410 that provide an input to the RF divider 404. The RF source 408 generates a sinusoidal signal with correct frequency and amplitude (digital in, analog RF signal out). In the illustrated embodiment, the RF preamplifier 410 amplifies a low power level from the RF source 408 to the RF divider 404 that divides the preamplifier output signal to the power amplifiers 406. An alternating-current/direct current (AC/DC) supply 412 or (or multiple AC/DC supplies 412) provides the power amplifiers 406 with DC power. The AC/DC supply 412 may be supplied by mains power supply (e.g., 3-phase, 230 volts AC (VAC)).

Optionally, a control sub-system 414 may monitor signals, such as signals from forward and reflected power from the amplifiers 406, using directional couplers (not shown). The control sub-system 414 may also manage protection/interlock signals and control the RF source and AC/DC supply 412. Optionally, the control sub-system 414 includes a RF signal loop control so that correct output power, frequency, etc. are maintained at the load throughout operation.

In alternative embodiments, the power-control system 400 may utilize a power source for each amplifier, which would eliminate the power divider. Moreover, dividing/combining could be made into several stages instead of a single stage for each, as shown in FIG. 14. Optionally, the single output load in FIG. 14 could be two or more output loads in some embodiments. For example, two output coupling elements may be used to adjust and supply the two dee electrodes of a cyclotron individually.

FIGS. 20-24 illustrate how the geometry of the TL resonator described herein, thus characteristic impedance ($Z_O$), can be varied along a length (Z-axis to achieve a specific property or a combination of properties. A change in $Z_O$ will change the E- and H-field distribution, but it can also be beneficial to change the geometry to be able to couple to the cavity more easily or to incorporate a frequency tuning device. By increasing the inner conductor diameter, or reducing the outer, at the open end the length can be slightly reduced for the same resonance frequency.

Figure 25:
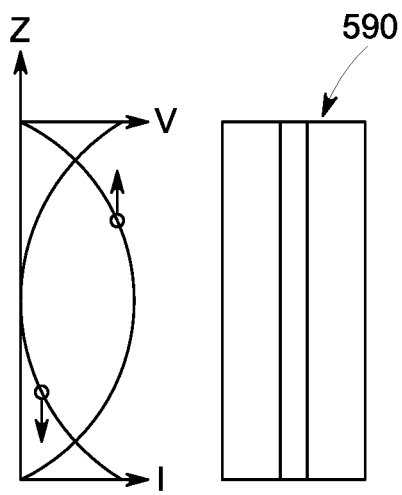
FIG. 25 illustrates how RF voltage and current and E- and H-fields change within a cavity of a half-wavelength resonator.
Figure 26:
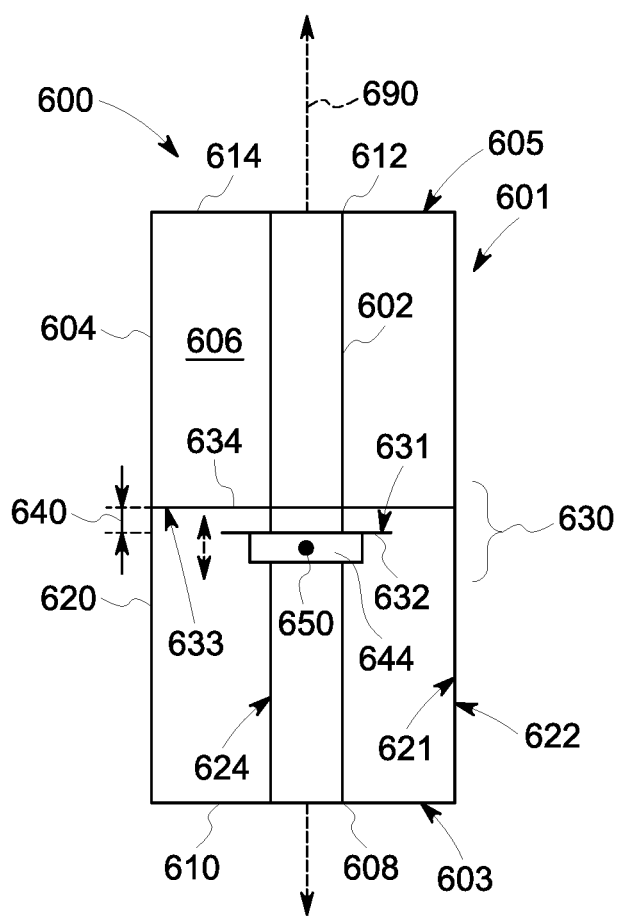
FIG. 26 is a schematic side view of a power combiner formed in accordance with an embodiment.
Figure 27:
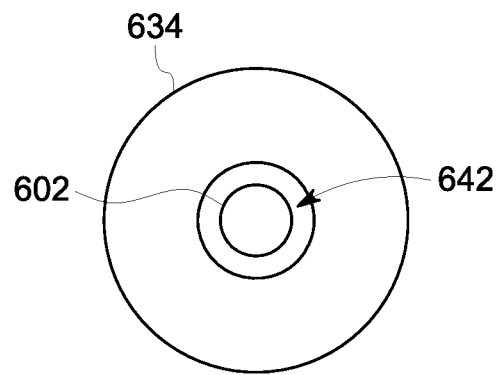
FIG. 27 is a plan view of a coupling plate that may be used by the power combiner of FIG. 26.

As described above, the power combiner/divider may include a HW resonator in some embodiments. FIGS. 25-27 illustrate such an embodiment. As shown in FIG. 25, the RF voltage has a maximum value at a mid-point of a HW resonator 590. For embodiments that include a capacitive element, the capacitive element may be positioned essentially at the mid-point. The capacitive element, however, may have other positions within the cavity.

FIG. 26 is a schematic side view of a power combiner/divider 600. The power combiner/divider 600 may include features that are similar or identical to the features described herein for other power combiner/dividers. The power combiner/divider 600 includes a TL resonator 601 having an inner conductor 602, and outer conductor 604 that surrounds the inner conductor 602, and a cavity 606 therebetween. The TL resonator 601 extends between a first end 603 (or proximal end) and a second end 605 (or distal end). A longitudinal axis 690 extends through the inner conductor 602 between the first and second ends 603, 605 of the TL resonator 601. The inner conductor 602 has a length that extends between first and second conductor ends 608, 612. The outer conductor 604 includes first and second end-walls 610, 614 that are located at the first and second ends 603, 605 of the TL resonator 601 in the illustrated embodiment.

The first conductor end 608 of the inner conductor 602 is directly connected to the first end-wall 610, and the second conductor end 612 is directly connected to the second end-wall 614. As shown, the first and second end-walls 610, 614 are planar walls that are parallel to each other. In other embodiments, at least one of the first and second end walls 610, 614 is non-planar and/or the end-walls are not parallel to one another.

The outer conductor 604 includes a conductive wall 620 having opposite interior and exterior surfaces 621, 622. The inner conductor 602 has a conductive surface 624 that faces radially-outward toward the interior surface 621. The cavity 606 is defined between the conductive surface 624 and the interior surface 621. Although not shown, the power combiner/divider 600 may include at least one input coupling element and at least one output coupling element. The input and output coupling elements may be similar or identical to the input and output coupling elements described herein.

The power combiner 600 also includes a capacitive element 630 that capacitively couples the inner and outer conductors 602, 604. The capacitive element 630 includes a first conductive surface 631 that is electrically connected to the inner conductor 602 and a second conductive surface 633 that is electrically connected to the outer conductor 604. The first and second conductive surfaces 631, 633 face each other and are separated by a gap 640. The first and second conductive surfaces 631, 633 face in opposite directions along the longitudinal axis 690.

In the illustrated embodiment, the capacitive element 630 includes a coupling plate 632 that is connected to the inner conductor 602 and a coupling plate 634 that is connected to the outer conductor 604. In the illustrated embodiment, the coupling plate 632 includes the first conductive surface 631, and the coupling plate 634 includes the second conductive surface 633. The coupling plates 632, 634 are spaced apart from each other with the gap 640 between the first conductive surface 631 and the second conductive surface 633. For embodiments that utilize the coupling plate 634, the coupling plates 632, 634 may be referred to as the inner coupling plate 632 and the outer coupling plate 634, respectively.

The coupling plate 634 is connected to the outer conductor 604. As shown in FIG. 27, the coupling plate 634 may be disc-shaped having a hole 642 and extending entirely around the inner conductor 602. A radial gap or separation distance exists between an edge of the coupling plate 634 and the inner conductor 602. The outer conductor 604 (FIG. 26) and the coupling plate 632 (FIG. 26) are not shown in FIG. 27.

Returning to FIG. 26, the coupling plate 632 is supported by a collar 644. The coupling plate 632 also extends entirely around the inner conductor 602. The coupling plate 632 may have an edge that is directly connected to the inner conductor 602, or the collar 644 may electrically connect the coupling plate 632 and the inner conductor 602. Optionally, the coupling plate 632 is movable along the inner conductor 602 to tune the resonance frequency. For example, a set screw 650 or other fastening mechanism may be used to fix the coupling plate 632 at a designated position or height so that the gap 640 defines a designated separation distance between the coupling plates 632, 634.

Figure 28:
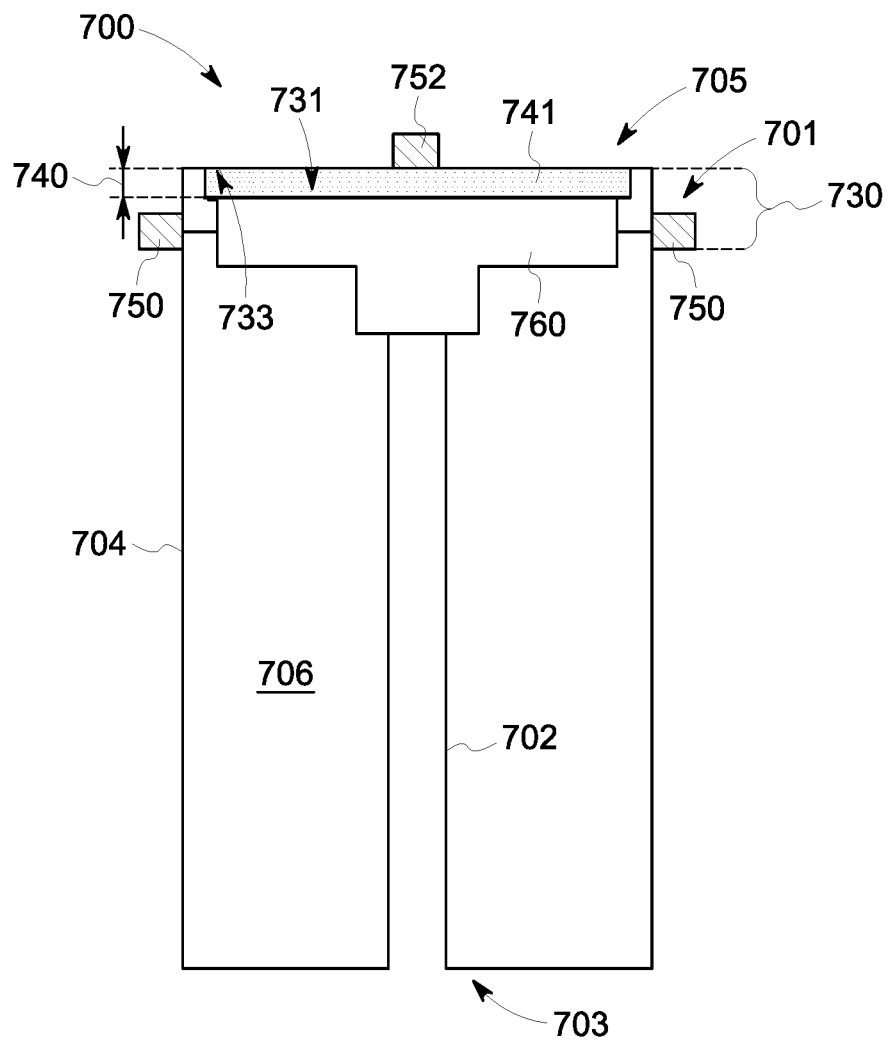
FIG. 28 is a schematic side view of a power combiner formed in accordance with an embodiment.

FIG. 28 is a side schematic view of a power combiner/divider 700 formed in accordance with an embodiment. The power combiner/divider 700 may include features that are similar or identical to the features described herein for other power combiner dividers. For example, the power combiner/divider 700 includes a transmission line (TL) resonator 701 comprising an inner conductor 702, an outer conductor 704 that surrounds the inner conductor 702, and a cavity 706 between the inner conductor 702 and the outer conductor 704. The inner conductor 702 and the outer conductor 704 are electrically connected at a first end 703 (or proximal end) of the TL resonator 701.

The power combiner/divider 700 also includes coupling elements extending through respective openings (not shown) of the outer conductor 704 and into the cavity 706. As shown, the coupling elements include a plurality of input coupling elements 750 for combining power from multiple sources and a single output 752 coupling element for providing power to a load. The input coupling elements 750 may circumferentially surround the inner and outer conductors 702, 704.

The power combiner/divider 700 also includes a capacitive element 730 that capacitively couples the inner conductor 702 and the outer conductor 704 at a second end 705 (or distal end) of the TL resonator 701. The capacitive element 730 includes a first conductive surface 731 that is electrically connected to the inner conductor 702 and a second conductive surface 733 that is electrically connected to the outer conductor 704. The first and second conductive surfaces 731, 733 face each other and are separated by a gap 740.

Optionally, the capacitive element 730 may include a dielectric material 741 positioned between the first and second conductive surfaces 731, 733. The dielectric material 741 may form a dielectric layer. For example, the dielectric material 741 may be at least a portion of a polyimide layer. As shown in FIG. 28, the dielectric material 741 engages each of the first and second conductive surfaces 731, 733. The dielectric material 741 may be adhered or bonded to the first and second conductive surfaces 731, 733 such that the dielectric material 741 is sandwiched between the first and second conductive surfaces 731, 733.

In the illustrated embodiment, the input coupling elements 750 and the output coupling element 752 are tapped-in coupling elements that electrically connect to the inner conductor 702. As shown, the input coupling elements 750 and the output coupling element 752 directly connect to a conductive structure 760 that forms a portion of the capacitive element 730. For example, the conductive structure 760 is T-shaped and includes the first conductive surface 731.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A power combiner/divider comprising:
a transmission line (TL) resonator comprising an inner conductor, an outer conductor that surrounds the inner conductor, and a cavity between the inner conductor and the outer conductor, wherein the inner conductor and the outer conductor are electrically connected at a proximal end of the TL resonator;
coupling elements extending through respective openings of the outer conductor and into the cavity, wherein the coupling elements include a plurality of input coupling elements for combining power from multiple sources or a plurality of output coupling elements for dividing power for multiple loads, wherein at least one of the coupling elements includes (1) a capacitive coupling element that is positioned within a radial portion of the cavity between the inner conductor and the outer conductor, (2) an inductive coupling element, or (3) a tapped-in coupling element that is connected to the inner conductor; and
a capacitive element connected to at least one of the inner conductor or the outer conductor, the capacitive element capacitively coupling the inner conductor and the outer conductor at a distal end of the TL resonator.

2. The power combiner/divider of claim 1, wherein the TL resonator is a quarter-wavelength TL resonator having an operating frequency that is between 10 and 300 megahertz (MHz).

3. The power combiner/divider of claim 1, wherein the TL resonator extends lengthwise along a longitudinal axis, the capacitive element including a first conductive surface that is electrically connected to the inner conductor and a second conductive surface that is electrically connected to the outer conductor, the first and second conductive surfaces facing each other and being separated by a gap.

4. The power combiner/divider of claim 3, wherein the capacitive element includes a dielectric material between the first and second conductive surfaces.

5. The power combiner/divider of claim 1, wherein the coupling elements include at least ten (10) input coupling elements.

6. The power combiner/divider of claim 1, wherein the at least one of the coupling elements includes the capacitive coupling element that is positioned within the radial portion of the cavity between the inner conductor and the outer conductor.

7. The power combiner/divider of claim 6, wherein the capacitive coupling element includes a coupling plate, the coupling plate being movable within the radial portion of the cavity to adjust an amount of capacitive coupling.

8. The power combiner/divider of claim 1, wherein the at least one of the coupling elements includes the inductive coupling element.

9. The power combiner/divider of claim 8, wherein the inductive coupling element includes a movable element within the cavity and a secured element that electrically connects the movable element to the outer conductor, the movable element configured to move within the cavity to adjust an amount of inductive coupling.

10. The power combiner/divider of claim 1, wherein the at least one of the coupling elements includes the tapped-in coupling element that is connected to the inner conductor.

11. The power combiner/divider of claim 10, wherein the tapped-in coupling element is movable along a length of the inner conductor.

12. The power combiner/divider of claim 1, further comprising a bandwidth adjuster coupled to the outer conductor.

13. The power combiner/divider of claim 12, wherein the bandwidth adjuster includes a movable element within the cavity that is coupled to a dummy load or a dummy resistor.

14. A power-control system comprising:
a power divider;
a power combiner; and
a plurality of power amplifiers, wherein the power amplifiers receive respective inputs from the power divider and provide respective outputs to the power combiner;
wherein at least one of the power divider or the power combiner includes:
a transmission line (TL) resonator comprising an inner conductor, an outer conductor that surrounds the inner conductor, and a cavity between the inner conductor and the outer conductor, wherein the inner conductor and the outer conductor are electrically connected at a proximal end of the TL resonator; and
a capacitive element connected to at least one of the inner conductor or the outer conductor, the capacitive element capacitively coupling the inner conductor and the outer conductor at a distal end of the TL resonator.

15. The power-control system of claim 14, wherein the TL resonator is a quarter-wavelength TL resonator having an operating frequency that is between 10 and 300 megahertz (MHz).

16. The power-control system of claim 14, wherein the TL resonator extends lengthwise along a longitudinal axis, the capacitive element including a first conductive surface that is electrically connected to the inner conductor and a second conductive surface that is electrically connected to the outer conductor, the first and second conductive surfaces facing each other and being separated by a gap.

17. The power-control system of claim 16, wherein the capacitive element includes a dielectric material between the first and second conductive surfaces.

18. The power-control system of claim 14, further comprising coupling elements that extend through respective openings of the outer conductor and into the cavity, wherein the coupling elements include at least ten (10) coupling elements.

19. A power combiner/divider comprising:
a transmission line (TL) resonator comprising an inner conductor, an outer conductor that surrounds the inner conductor, and a cavity between the inner conductor and the outer conductor, wherein the inner conductor has opposite first and second ends and is electrically connected to the outer conductor at the first and second ends;
coupling elements extending through respective openings of the outer conductor and into the cavity, wherein the coupling elements include a plurality of input coupling elements for combining power from multiple sources or a plurality of output coupling elements for dividing power into multiple loads; and
a capacitive element that capacitively couples the inner and outer conductors, the capacitive element including a first conductive surface that is electrically connected to the inner conductor and a second conductive surface that is electrically connected to the outer conductor, the first and second conductive surfaces facing each other and being separated by a gap.

20. The power combiner/divider of claim 19, wherein at least one of:
   the capacitive element includes an inner coupling plate having the first conductive surface and an outer coupling plate having the second conductive surface, the outer coupling plate and the inner coupling plate having the gap therebetween; or
   the TL resonator is a half-wavelength TL resonator, the capacitive element being positioned essentially at a mid-point of the inner conductor.

21. A power combiner/divider comprising:
   a transmission line (TL) resonator comprising an inner conductor, an outer conductor that surrounds the inner conductor, and a cavity between the inner conductor and the outer conductor, wherein the inner conductor and the outer conductor are electrically connected at a proximal end of the TL resonator, wherein the inner and outer conductors extend along a Z-axis;
   coupling elements extending through respective openings of the outer conductor and into the cavity, wherein the coupling elements include a plurality of input coupling elements for combining power from multiple sources or a plurality of output coupling elements for dividing power for multiple loads, wherein at least one of the input coupling elements or the output coupling elements has a different position along the Z-axis relative to one or more of the other coupling elements; and
   a capacitive element connected to at least one of the inner conductor or the outer conductor, the capacitive element capacitively coupling the inner conductor and the outer conductor at a distal end of the TL resonator.

\* \* \* \* \*